(12) United States Patent
Chen

(10) Patent No.: US 11,881,546 B2
(45) Date of Patent: Jan. 23, 2024

(54) DEVICE WITH LIGHT-EMITTING DIODE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 125 days.

(21) Appl. No.: 16/705,203

(22) Filed: Dec. 5, 2019

(65) Prior Publication Data
US 2021/0175400 A1    Jun. 10, 2021

(51) Int. Cl.
*H01L 33/62*    (2010.01)
*H01L 33/42*    (2010.01)

(52) U.S. Cl.
CPC ............. *H01L 33/62* (2013.01); *H01L 33/42* (2013.01)

(58) Field of Classification Search
CPC . H01L 33/387; H01L 2933/016; H01L 33/62; H01L 2933/0025; H01L 25/0753; H01L 27/15–156; H10K 59/122; H10K 59/173; H10K 59/87; H10K 59/873; H10K 59/8731; H10K 59/88
See application file for complete search history.

(56) References Cited

U.S. PATENT DOCUMENTS 10,121,772 B1* 11/2018 Wu ..................... H01L 25/0753
10,490,536 B2* 11/2019 Wu ...................... H01L 25/167
2009/0127573 A1   5/2009 Guenther et al.
2017/0352308 A1* 12/2017 Park ...................... H01L 31/167
2017/0358624 A1* 12/2017 Takeya ................... H01L 25/167
2018/0261796 A1*  9/2018 Jang ..................... H01L 51/5206
2019/0393386 A1* 12/2019 Shimoda ................. H01L 33/44
2020/0313101 A1* 10/2020 Jung .................... H01L 51/5237

FOREIGN PATENT DOCUMENTS

CN    102270653 A    12/2011
CN    105324858 A    2/2016
TW    201515262 A    4/2015

* cited by examiner

*Primary Examiner* — Phat X Cao
*Assistant Examiner* — Diana C Vieira
(74) *Attorney, Agent, or Firm* — CKC & Partners Co., LLC

(57) ABSTRACT

A device with a light-emitting diode includes a substrate, a first conductive pad and a second conductive pad, a light-emitting diode, a metal protrusion, a polymer layer, and a top electrode. The substrate has a top surface. The first conductive pad and the second conductive pad are on the substrate. The light-emitting diode is on the first conductive pad. The metal protrusion is on the second conductive pad. The polymer layer covers the top surface of the substrate, the first conductive pad, the second conductive pad, the metal protrusion, and the light-emitting diode, in which a distance from a top of the metal protrusion to the top surface of the substrate is greater than a thickness of the polymer layer. The top electrode covers the light-emitting diode, the polymer layer, and the metal protrusion such that the light-emitting diode is electrically connected with the second conductive pad.

14 Claims, 4 Drawing Sheets

DEVICE WITH LIGHT-EMITTING DIODE

BACKGROUND

Field of Invention

The present disclosure relates to a device with a light-emitting diode.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a device with a light-emitting diode includes a substrate, a first conductive pad and a second conductive pad, a light-emitting diode, a metal protrusion, a polymer layer, and a top electrode. The substrate has a top surface. The first conductive pad and the second conductive pad are on the substrate. The light-emitting diode is on the first conductive pad. The metal protrusion is on the second conductive pad. The polymer layer covers the top surface of the substrate, the first conductive pad, the second conductive pad, the metal protrusion, and the light-emitting diode, in which a distance from a top of the metal protrusion to the top surface of the substrate is greater than a thickness of the polymer layer. The top electrode covers the light-emitting diode, the polymer layer, and the metal protrusion such that the light-emitting diode is electrically connected with the second conductive pad.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
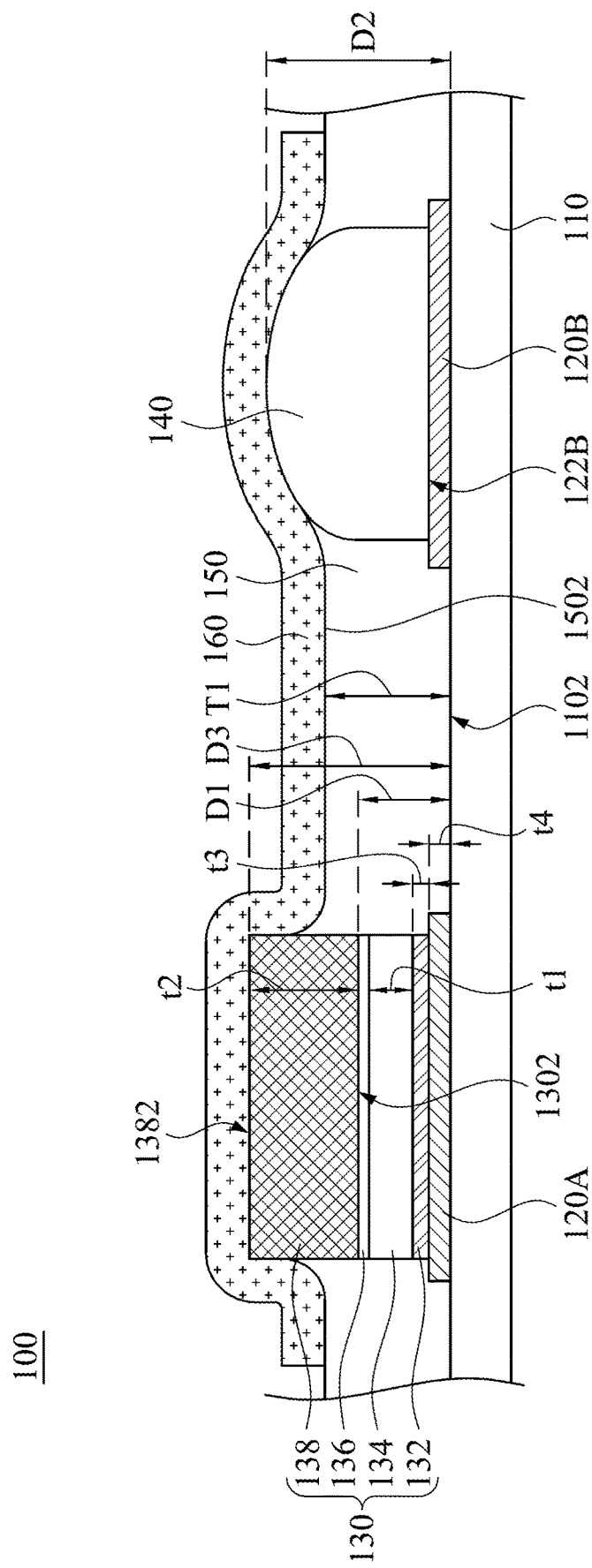
FIG. 1A is a schematic cross-sectional view of a device with a light-emitting diode according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

FIG. 1A is a schematic cross-sectional view of a device 100 with a light-emitting diode 130 according to some embodiments of the present disclosure. The device 100 includes a substrate 110, a first conductive pad 120A, a second conductive pad 120B, a light-emitting diode 130, a metal protrusion 140, a polymer layer 150, and a top electrode 160. The substrate 110 has a top surface 1102. The first conductive pad 120A and the second conductive pad 120B are on the top surface 1102 of the substrate 110. The light-emitting diode 130 is bonded on the first conductive pad 120A. The metal protrusion 140 is on the second conductive pad 120B.

The light-emitting diode 130 includes a bottom electrode 132, a first type semiconductor layer 134, an active layer 136, and a second type semiconductor layer 138. The first type semiconductor layer 134 is on the bottom electrode 132. The active layer 136 is on the first type semiconductor layer 134. The second type semiconductor layer 138 is on the active layer 136. The bottom electrode 132 is in contact with the first conductive pad 120A when the light-emitting diode 130 is bonded to the first conductive pad 120A. In the present embodiment, the light-emitting diode 130 is a vertical type light-emitting diode.

The polymer layer 150 covers the top surface 1102 of the substrate 110, the first conductive pad 120A, the second conductive pad 120B, the metal protrusion 140, and the light-emitting diode 130. The polymer layer 150 has a thickness T1 which is equal to a distance from a top surface 1502 of the polymer layer 150 to the top surface 1102 of the substrate 110.

The top electrode 160 covers the light-emitting diode 130, the polymer layer 150, and the metal protrusion 140 such that the light-emitting diode 130 is electrically connected with the second conductive pad 1206. Specifically, the top electrode 160 is in contact with a top surface 1382 of the second type semiconductor layer 138 and the metal protrusion 140. In some embodiments, the top electrode 160 is transparent so that light emitted from the light-emitting diode 130 can transmit through the top electrode 160 to enhance light extraction efficiency. In some embodiments, the top electrode 160 may be Indium Tin Oxide (ITO) or contains metal nanowires.

A distance D2 from a top of the metal protrusion 140 to the top surface 1102 of the substrate 110 (i.e., the largest longitudinal height of the metal protrusion 140) is greater than the thickness T1 of the polymer layer 150. Furthermore, a distance D3 from the top surface 1382 of the second type semiconductor layer 138 to the top surface 1102 of the substrate 110 is greater than the thickness T1. In other words, the top surface 1382 of the second type semiconductor layer 138 and the top of the metal protrusion 140 are not completely covered by the polymer layer 150 and are both in contact with the top electrode 160. Therefore, there is no need to further form openings in the polymer layer 150 to expose the second type semiconductor layer 138 and the second conductive pad 120B since the distance D2 and the distance D3 are greater than the thickness T1. In addition, the top electrode 160 can be directly formed on the top surface 1382 of the second type semiconductor layer 138, the top of the metal protrusion 140, and the top surface 1502 of the polymer layer. Therefore, there is no need to form the top electrode 160 in the openings whose aspect ratio may affect the efficiency of the electrical connection. Accordingly, the manufacturing cost can be reduced and the manufacturing efficiency can be improved.

The thickness T1 of the polymer layer 150 is greater than a distance D1 from the interface 1302 between the second type semiconductor layer 138 and the active layer 136 to the top surface 1102 of the substrate 110. Therefore, the active layer 136 and the first type semiconductor layer 134 are covered by the polymer layer 150 such that the electrical insulation between the first type semiconductor layer 134 and the second type semiconductor layer 138 can be maintained.

Figure 1B:
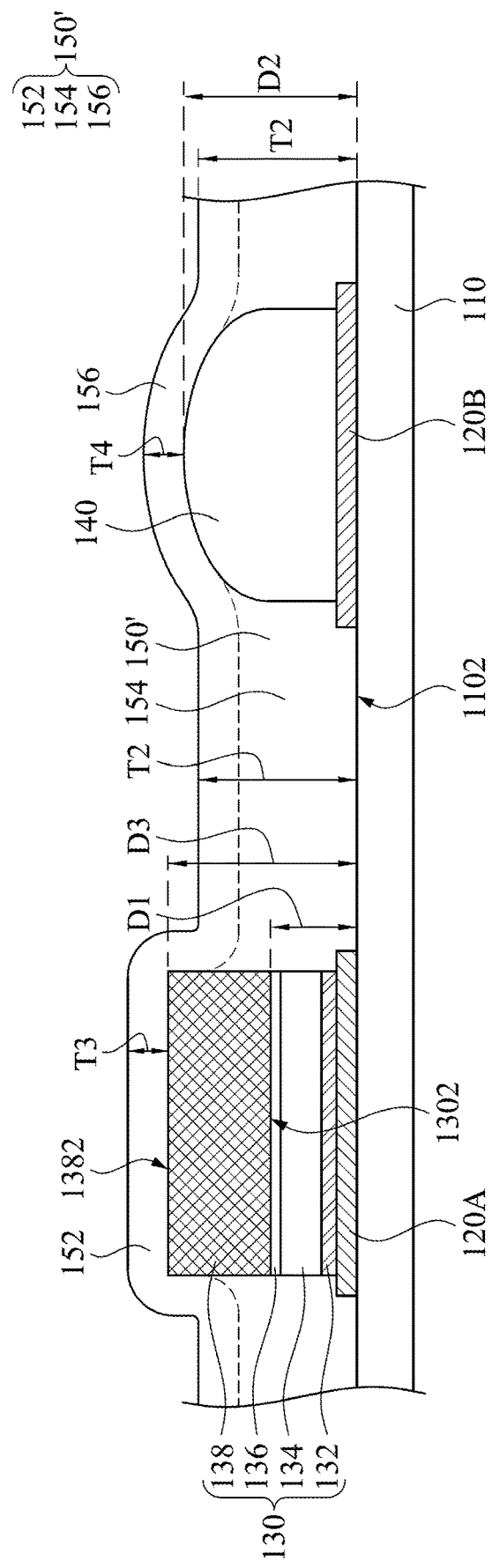
FIG. 1B is a schematic cross-sectional view of an intermediate stage of the forming of the device 100 with the light-emitting diode 130 in FIG. 1A.

FIG. 1B is a schematic cross-sectional view of an intermediate stage of the forming of the device 100 with the light-emitting diode 130 in FIG. 1A. The device 100 in FIG. 1B is at a stage before the top electrode 160 is formed and before the polymer layer 150' is etched. Reference is made to FIG. 1A and FIG. 1B. In the present embodiment, the distance D2 of the metal protrusion 140 is smaller than about 0.8 times the distance D3 and is greater than the distance D1 from the interface 1302 between the second type semiconductor layer 138 and the active layer 136 to the top surface 1102 of the substrate 110. Before the polymer layer 150' is etched, the top surface 1382 of the second type semiconductor layer 138 and the top of the metal protrusion 140 are both covered by the polymer layer 150'. The polymer layer 150' includes a first portion 152 overlying the light-emitting diode 130, a second portion 154 being free from overlapping with the light-emitting diode 130 and the second conductive pad 120B, and a third portion 156 overlying the metal protrusion 140. The first portion 152 has a thickness T3, and the second portion 154 has a thickness T4 that is a minimum longitudinal distance from the top of the metal protrusion 140 to the top surface of the polymer layer 150'. In this embodiment, the thickness T4 may be greater than the thickness T3.

In some embodiments, the etching can be performed by ashing and plasma etching, but the present disclosure is not limited in this regard. The etching rate from the uppermost surface of the polymer layer 150' is substantially the same. In other words, the first portion 152, the second portion 154, and the third portion 156 are equally etched from the uppermost surface of the polymer layer 150'. In some other embodiments, the polymer layer 150' may be a positive photoresist layer, and the etching can be performed by a partial exposure process followed by a development process. For example, the polymer layer 150' is exposed under weak exposure dose by UV light, but the present disclosure is not limited in this regard. Specifically, the photo-sensitive materials of the first portion 152 is all degraded, and parts of the second portion 154 and the third portion 156 away from the substrate 110 are degraded.

Therefore, the thickness T2 of the polymer layer 150' is reduced to the thickness T1 as shown in FIG. 1A after the polymer layer 150' is etched, and the thickness T1 is at most equal to a difference between the thickness T2 and the thickness T4. That is, after the polymer layer 150' is etched, the top surface 1382 of the second type semiconductor layer 138 and the top of the metal protrusion 140 are exposed from the polymer layer 150. Accordingly, with the configurations of thickness and distance as mentioned above, the top surface 1382 of the second type semiconductor layer 138 and the top of the metal protrusion 140 can be exposed in one step, and the step of forming a mask to pattern the polymer layer 150 can be omitted. Therefore, the manufacturing cost can be reduced and the manufacturing efficiency can be improved.

In some embodiments, the polymer layer 150' is formed by spin coating or slit coating so as to form the configuration of the polymer layer 150' and satisfy the relation: T2−T4>D1 in one coating step. In some embodiments, the polymer layer 150 includes titanium oxide (TiO2) nanoparticles to increase a refractive index of the polymer layer 150 to further enhance the light extraction efficiency.

In some other embodiment, the thickness T3 may be greater than the thickness T4. Under this condition, for example, the distance D2 may be greater than 0.8 times the distance D3 but smaller than 1.2 times the distance D3. Before the polymer layer 150' is etched, the top surface 1382 of the second type semiconductor layer 138 and the top of the metal protrusion 140 are both covered by the polymer layer 150'. After the polymer layer 150' is etched, the thickness T2 of the polymer layer 150' is reduced to the thickness T1 as shown in FIG. 1A, and the thickness T1 is at most equal to a difference between the thickness T2 and the thickness T3.

During the exposure process, the exposure light may be partially reflected by the metal protrusion 140. As a result, the exposure efficiency for the material of the third portion 156 of the polymer layer 150' may be reduced such that a depth of the material of the third portion 156 that is degraded may be smaller than the depths of the material of the first portion 152 and the second portion 154 that is degraded. Therefore, a greater distance D2 of the metal protrusion 140 may prevent the exposure efficiency from being affected by the reflection characteristics of the metal protrusion 140.

In some embodiments, the first type semiconductor layer 134 is a p-type semiconductor layer, and the second type semiconductor layer 138 is an n-type semiconductor layer. Under this condition, the thicker layer is the n-type semiconductor layer which has lower resistivity compared to the p-type semiconductor layer, which leads to better light-emitting efficiency because the p-type semiconductor layer which has higher resistivity and contact resistance is already fully in contact with the bottom electrode 132 before the light-emitting diode 130 is bonded to the first conductive pad 120A. In some embodiments, a thickness of the p-type semiconductor layer (i.e., a thickness t1 of the first type semiconductor layer 134) is about 250 nm and a thickness of the active layer 136 is about 150 nm. In some embodiments, the light-emitting diode 130 further includes an electron blocking layer (not shown) between the active layer 136 and the first type semiconductor layer 134 so as to prevent electrons (which flow from the n-type semiconductor layer towards the active layer 136) from flowing out of the active layer 136 (and into the p-type semiconductor layer) and thus the light-emitting efficiency is enhanced.

In some embodiments, a ratio between a thickness t2 of the second type semiconductor layer 138 and a thickness t1 of the first type semiconductor layer 134 is greater than or equal to about 1.5. When the second type semiconductor layer 138 is thicker than the first type semiconductor layer 134, there is a higher possibility for a thickness T1 of the polymer layer 150 to be greater than the distance D1. Therefore, the thickness relation between the second type semiconductor layer 138 and the first type semiconductor layer 134 can increase the tolerance of the criterion: T1>D1 as mentioned above. In some embodiments, since the largest possible distance D1 is equal to or smaller than about 2 μm, the thickness T1 of the polymer layer 150 is greater than or equal to about 2 μm such that the electrical insulation between the first type semiconductor layer 134 and the second type semiconductor layer 138 can be better maintained.

Furthermore, in some embodiments, in case the light-emitting diode 130 is absent on the first conductive pad 120A due to defects when the light-emitting diodes 130 are massively transferred to the substrate 110, a portion of the polymer layer 150 overlying the first conductive pad 120A will be thicker by using the polymer layer 150 forming process as described. For example, the portion of the polymer layer 150 overlying the first conductive pad 120A may be as thick as the third portion 156, and the first conductive pad 120A can still be covered by the remaining polymer layer 150 after the developing process. Therefore, the electrical insulation between the top electrode 160 and the first conductive pad 120A can be maintained, thereby preventing the electrical short that may occur in conventional manufacturing process.

Figure 2A:
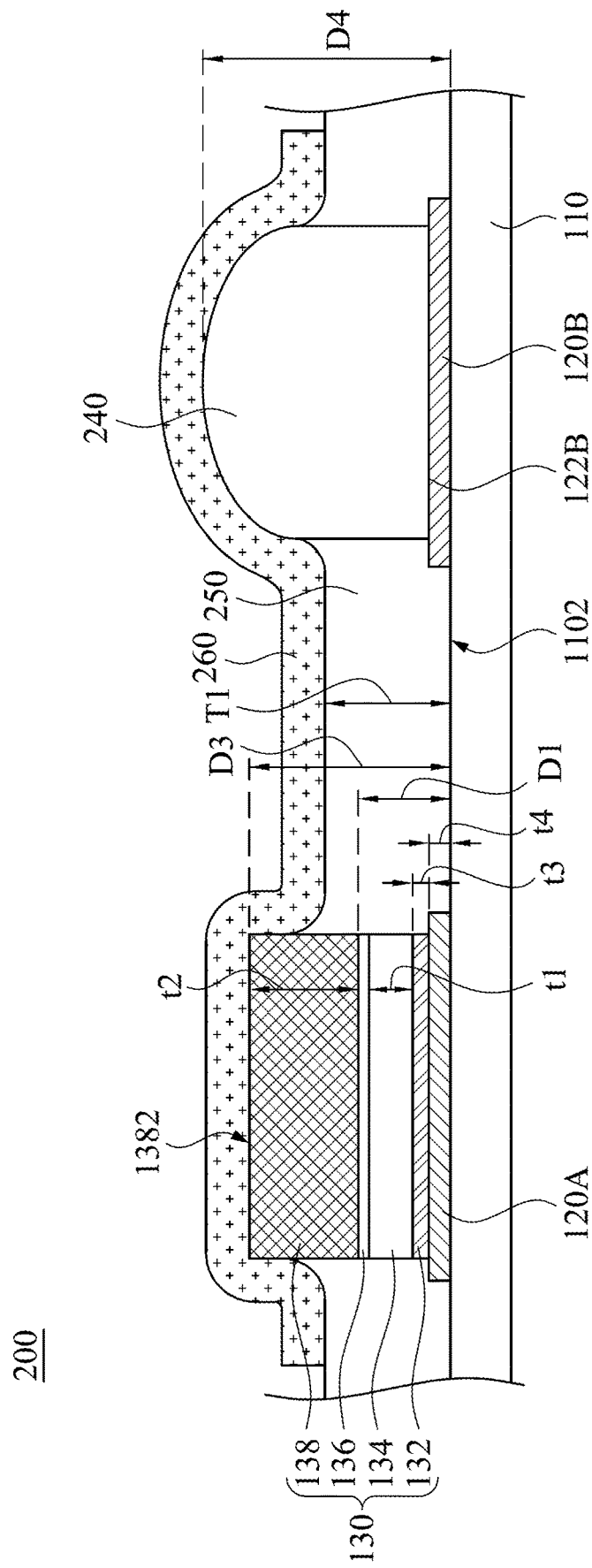
FIG. 2A is a schematic cross-sectional view of a device with a light-emitting diode according to some embodiments of the present disclosure.
Figure 2B:
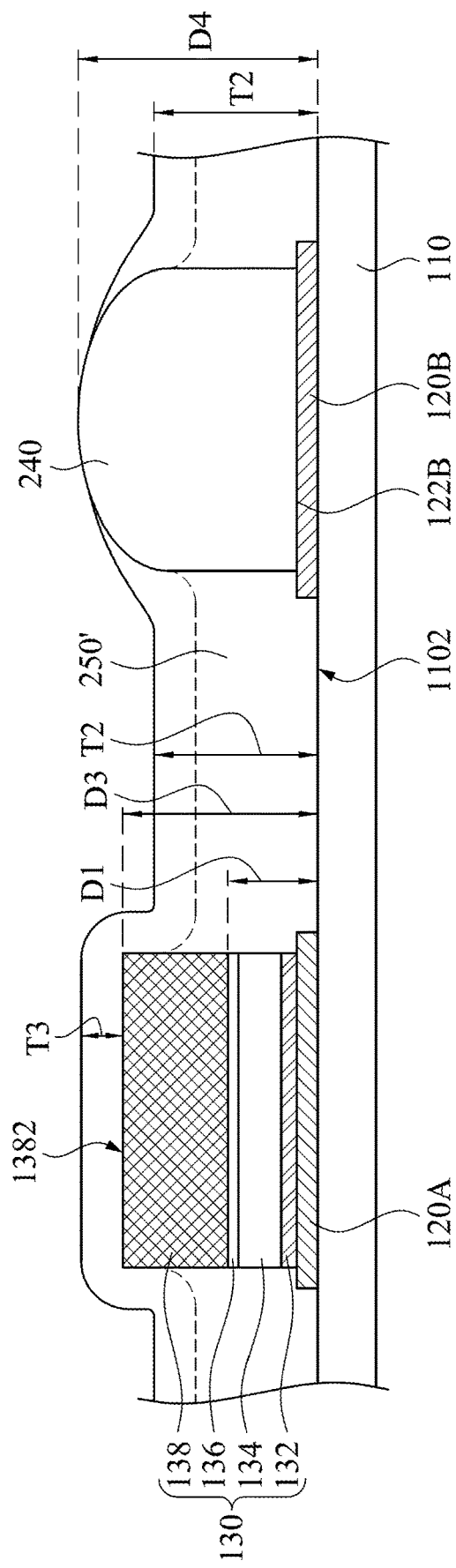
FIG. 2B is a schematic cross-sectional view of an intermediate stage of the forming of the device with the light-emitting diode in FIG. 2A.

FIG. 2A is a schematic cross-sectional view of a device 200 with a light-emitting diode according to some embodiments of the present disclosure. FIG. 2B is a schematic cross-sectional view of an intermediate stage of the forming of the device with the light-emitting diode in FIG. 2A. The device 200 in FIG. 2B is at a stage before the top electrode 260 is formed and before the polymer layer 250' is etched. Reference is made to FIG. 2A and FIG. 2B. The device 200 in FIG. 2A is similar to the device 100 in FIG. 1A, and the difference is that a distance D4 from a top of the metal protrusion 240 to the top surface 1102 of the substrate 110 is higher than the distance D3 from the top surface 1382 of the second type semiconductor layer 138 of the light-emitting diode 130 to the top surface 1102 of the substrate 110. The structure shown in FIG. 2B is similar to the structure shown in FIG. 1B, the difference is that before the polymer layer 250' is etched, a top of the metal protrusion 240 is not completely covered by the polymer layer 250'. In other words, the metal protrusion 240 is already exposed from the polymer layer 250' before the polymer layer 250' is etched. Accordingly, with the configurations of thickness and distance as mentioned above, the top surface 1382 of the second type semiconductor layer 138 and the top of the metal protrusion 240 can be exposed after one etch step, and the step of forming a mask to pattern the polymer layer 250' can be omitted. Therefore, the manufacturing cost can be reduced and the manufacturing efficiency can be improved. Furthermore, since the metal protrusion 240 is not completely covered by the polymer layer 250' before the polymer layer 250' is etched, the reflection of the exposure light by the metal protrusion 240 would not affect the exposure efficiency and the electrical connection quality.

In some embodiments, the light-emitting diode 130 is a micro light-emitting diode having a lateral length less than or equal to about 50 μm. It is further noted that a preferable condition for a sum of a thickness t3 of the bottom electrode 132 and a thickness t4 of the first conductive pad 120A is smaller than or equal to about 2 μm. The 2 μm is a balance of size (i.e., the lateral length ≤ about 50 μm) of the micro light-emitting diode and a capability to have an interstitial diffusion between the bottom electrode 132 and the first conductive pad 120A when the micro light-emitting diode is bonded to the first conductive pad 120A. As a result, no melting process is performed during the bonding, and the micro light-emitting diode is better protected from damage during bonding and a position of the micro light-emitting diode relative to the first conductive pad 120 can be better controlled.

Due to the tiny size of the micro light-emitting diode, the alignment between the micro light-emitting diode and an opening for exposing the second type semiconductor layer of the micro light-emitting diode in a conventional manufacturing method may become more challenging. Therefore, by exposing the second type semiconductor layer of the micro light-emitting diode and the second conductive pad in one step can replace the step of forming the opening for exposing the top surface of the second type semiconductor layer, thereby preventing the electrical short due to the misalignment between the said opening and the micro light-emitting diode. Furthermore, in the conventional manufacturing method, it is more difficult to form the top electrode 160 in the opening (i.e., contact hole) with a smaller size. Therefore, the method of the present disclosure can omit the step of forming the top electrode 160 in openings that expose the second type semiconductor layer and the second conductive pad 120B, thereby improving the electrical connection quality. Accordingly, the design rule for forming a display device with a micro light-emitting diode can be achieved easier, or the pitch can even be shrink, thereby preventing the misalignment problem and improving the electrical connection quality.

In summary, the device with a light-emitting diode of the present disclosure provides a metal protrusion of which a distance from the top to the top surface of the substrate is greater than a thickness of the etched polymer layer, and the device can be obtained by exposing the top surface of the second type semiconductor layer of the light-emitting diode and the top of the metal protrusion from a polymer layer covering thereon in one etching step. Therefore, the step in the conventional manufacturing process of forming a mask for patterning an opening to expose the second conductive pad can be omitted, and the manufacturing cost can be reduced and the manufacturing efficiency can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A device, comprising:
   a substrate having a top surface;
   a first conductive pad and a second conductive pad on the substrate;
   a light-emitting diode on the first conductive pad;
   a metal protrusion on the second conductive pad, wherein the metal protrusion is in direct contact with the second conductive pad;
   a polymer layer covering the top surface of the substrate, the first conductive pad, and the second conductive pad and surrounding the metal protrusion and the light-emitting diode, wherein a distance from a top of the metal protrusion to the top surface of the substrate is greater than a thickness of the polymer layer, and a bottom surface of the metal protrusion is lower than a top surface of the polymer layer; and
   a top electrode covering the light-emitting diode, the polymer layer, and the metal protrusion such that the light-emitting diode is electrically connected with the second conductive pad, wherein a distance between a top surface of a portion of the top electrode overlying the metal protrusion to the top surface of the substrate is greater than a distance between a top surface of another portion of the top electrode free from overlapping with the metal protrusion and the light-emitting diode to the top surface of the substrate.

2. The device of claim 1, wherein the light-emitting diode comprises a bottom electrode, a first type semiconductor layer on the bottom electrode, an active layer on the first type semiconductor layer, and a second type semiconductor layer on the active layer, and a distance from the top of the metal protrusion to the top surface of the substrate is greater than a distance from an interface between the second type semiconductor layer and the active layer to the top surface of the substrate.

3. The device of claim 2, wherein the thickness of the polymer layer is greater than the distance from the interface between the second type semiconductor layer and the active layer to the top surface of the substrate.

4. The device of claim 2, wherein a sum of a thickness of the bottom electrode and a thickness of the first conductive pad is smaller than or equal to 2 μm.

5. The device of claim 2, wherein a ratio between a thickness of the second type semiconductor layer and a thickness of the first type semiconductor layer is greater than or equal to 1.5.

6. The device of claim 2, wherein the first type semiconductor layer is a p-type semiconductor layer, and the second type semiconductor layer is an n-type semiconductor layer.

7. The device of claim 1, wherein the top electrode is in contact with a top surface of the light-emitting diode and the metal protrusion.

8. The device of claim 1, wherein the polymer layer is a positive photoresist layer.

9. The device of claim 1, wherein the top electrode is transparent.

10. The device of claim 1, wherein the top electrode is a silver nanowire.

11. The device of claim 1, wherein the polymer layer comprises titanium oxide (TiO2) nanoparticles.

12. The device of claim 1, wherein the thickness of the polymer layer is greater than or equal to 2 μm.

13. The device of claim 1, wherein a lateral length of the light-emitting diode is less than or equal to 50 μm.

14. The device of claim 1, wherein a lateral length of the metal protrusion is less than or equal to 50 μm.

* * * * *